United States Patent
Lin et al.

(10) Patent No.: US 12,477,794 B2
(45) Date of Patent: Nov. 18, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Yan-Ting Lin, Hsinchu County (TW); Chien-I Kuo, Chiayi County (TW); Chii-Horng Li, Hsinchu County (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 637 days.

(21) Appl. No.: 17/711,707

(22) Filed: Apr. 1, 2022

(65) Prior Publication Data
US 2023/0317791 A1 Oct. 5, 2023

(51) Int. Cl.
*H10D 62/13* (2025.01)
*H10D 30/01* (2025.01)
(Continued)

(52) U.S. Cl.
CPC .......... *H10D 62/151* (2025.01); *H10D 30/031* (2025.01); *H10D 30/6735* (2025.01);
(Continued)

(58) Field of Classification Search
CPC .......... H01L 29/0847; H01L 29/42392; H01L 29/66742; H01L 29/7848; H01L 29/78696; H01L 21/02433; H01L 21/02532; H01L 21/02609; H01L 21/0262; H01L 29/045; H01L 29/0653; H01L 29/0665; H01L 29/167; H01L 29/41; H01L 29/66545; H01L 29/66553; H01L 29/0673; H01L 29/068; H01L 29/161; H01L 29/165; H01L 29/66439; H01L 29/775; H01L 21/02381; H01L 21/02579; B82Y 10/00; H10D 62/151; H10D 30/031; H10D 30/6735; H10D 30/6757; H10D 30/797; H10D 62/116; H10D 62/118; H10D 62/405; H10D 62/834; H10D 64/017; H10D 64/018; H10D 64/20; H10D 30/014; H10D 30/43; H10D 62/121; H10D 62/123; H10D 62/822; H10D 62/832
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Steven B Gauthier
*Assistant Examiner* — Sun Mi Kim King
(74) *Attorney, Agent, or Firm* — Maschoff Brennan

(57) ABSTRACT

A method includes forming a plurality of channel layers above a (110)-orientated substrate, the channel layers arranged in a <110> direction normal to a top surface the (110)-orientated substrate and extending in a <1$\bar{1}$0> direction perpendicular to the <110> direction; epitaxial growing a plurality of silicon layers on either side of each of the channel layers; doping the silicon layers with boron; epitaxial growing a plurality of first silicon germanium layers on the silicon layers; forming a gate structure surrounding each of the channel layers.

20 Claims, 19 Drawing Sheets

(51) Int. Cl.
  *H10D 30/67* (2025.01)
  *H10D 30/69* (2025.01)
  *H01L 21/02* (2006.01)
  *H10D 62/10* (2025.01)
  *H10D 62/40* (2025.01)
  *H10D 62/834* (2025.01)
  *H10D 64/01* (2025.01)
  *H10D 64/20* (2025.01)

(52) U.S. Cl.
  CPC ....... *H10D 30/6757* (2025.01); *H10D 30/797* (2025.01); *H01L 21/02433* (2013.01); *H01L 21/02532* (2013.01); *H01L 21/02609* (2013.01); *H01L 21/0262* (2013.01); *H10D 62/116* (2025.01); *H10D 62/118* (2025.01); *H10D 62/405* (2025.01); *H10D 62/834* (2025.01); *H10D 64/017* (2025.01); *H10D 64/018* (2025.01); *H10D 64/20* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0234002 A1* | 7/2021 | Lee .................. H01L 29/66439 |
| 2022/0069134 A1* | 3/2022 | Kim .................. H01L 29/66742 |
| 2023/0028591 A1* | 1/2023 | Kwok ............... H01L 21/02609 |

* cited by examiner

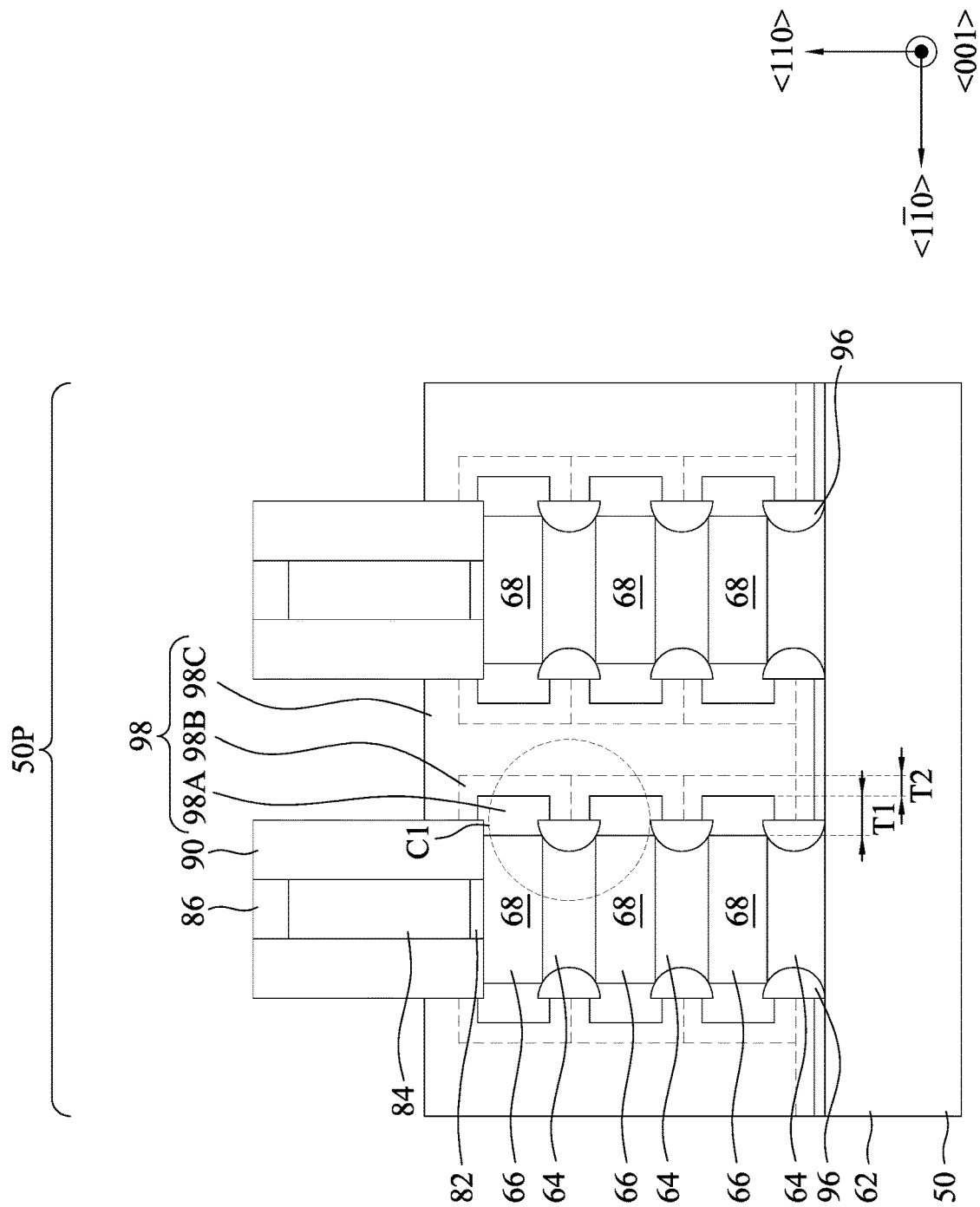

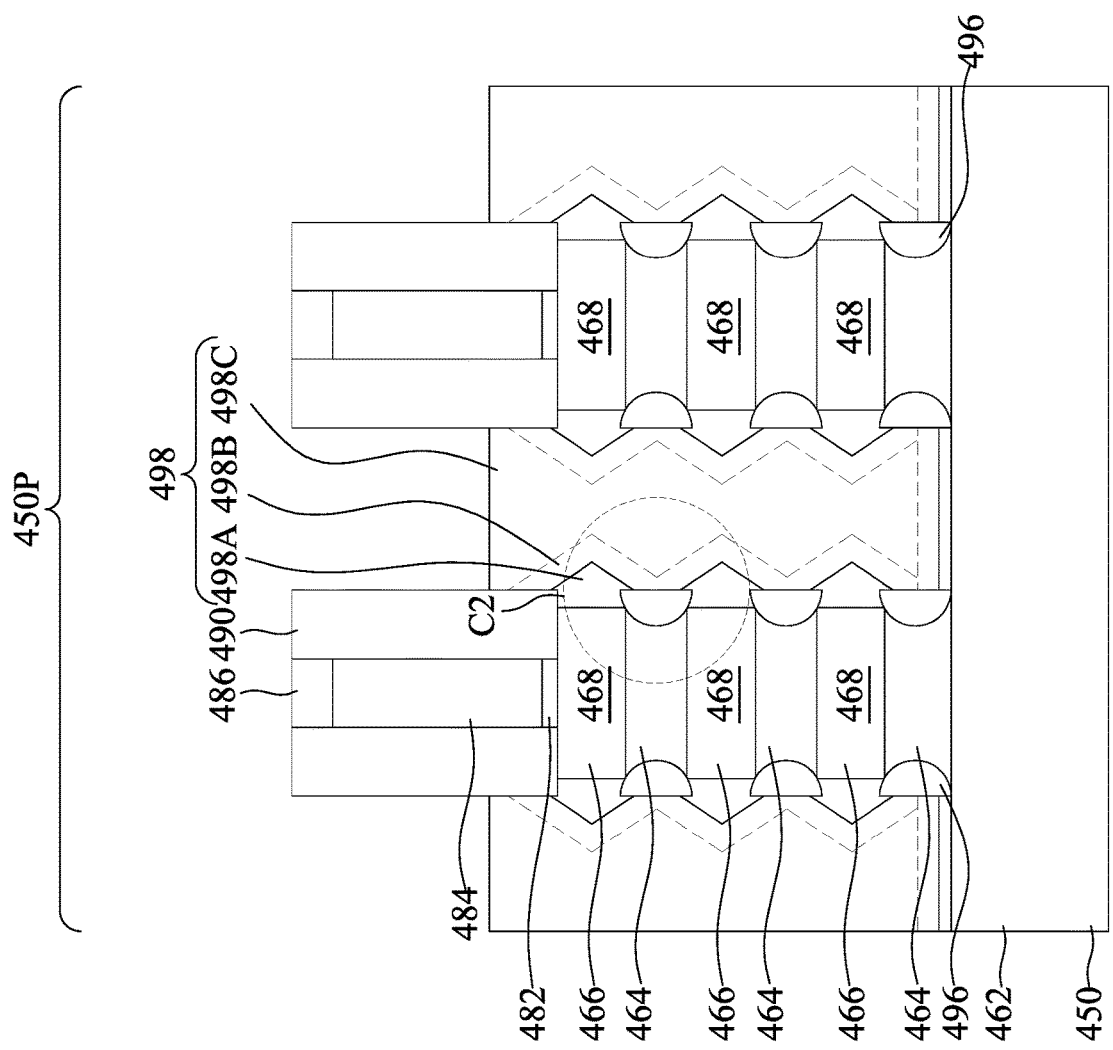

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-8, 9A, and 10-13 illustrate a method in various stages of forming a semiconductor device in accordance with some embodiments of the present disclosure.

FIGS. 9C, 9E, 9F, and 9G illustrate cross-sectional views of different semiconductor devices corresponding to FIG. 9A in accordance with some embodiments of the present disclosure.

DETAILED DESCRIPTION

Figure 1:
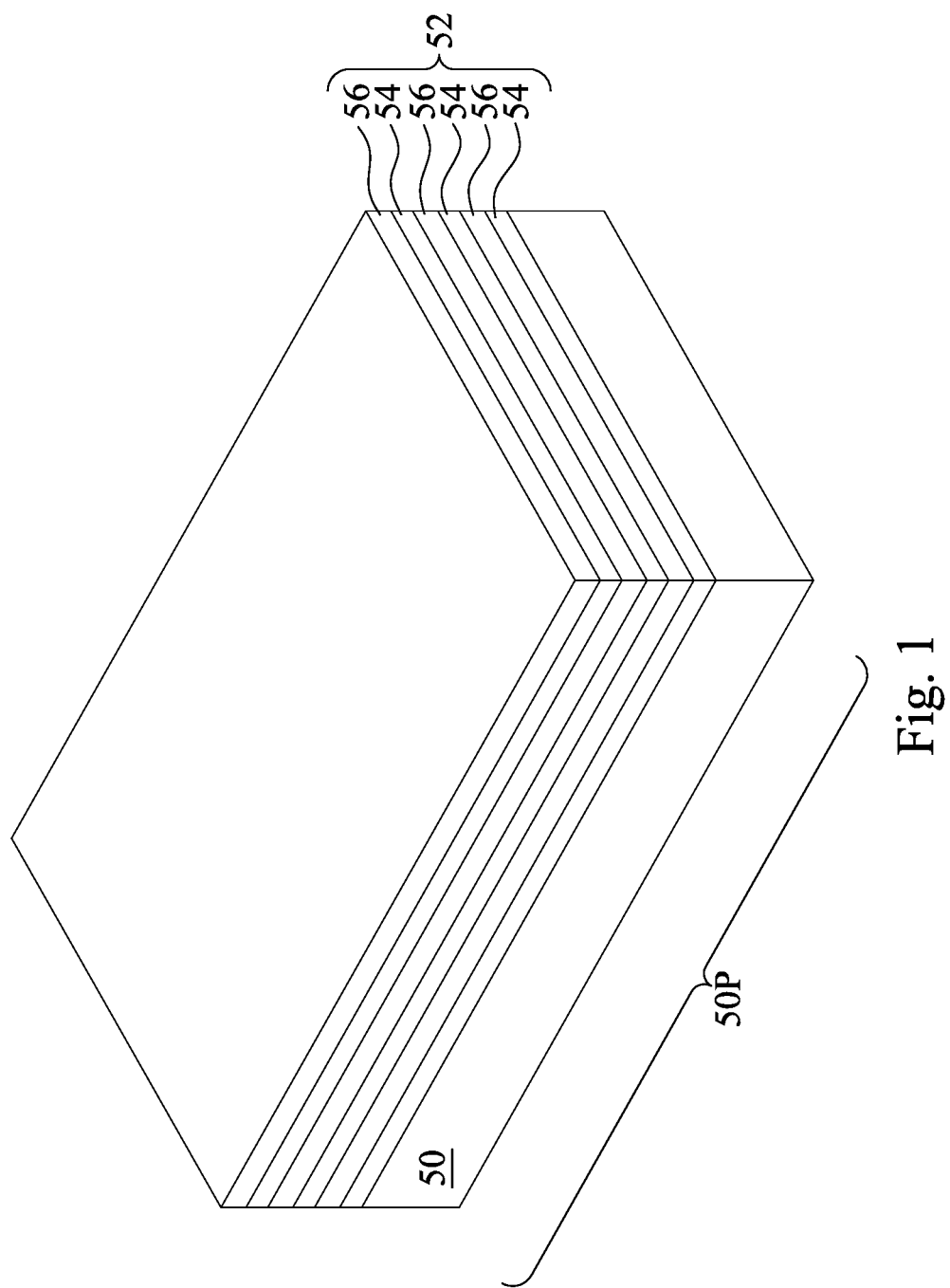

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In order to prevent the source/drain region damage (e.g., EPI damage) during the replacement gate (RPG) process, a boron doped silicon (Si:B) layer is formed to interpose the channel layer and the source/drain region (e.g., PMOS source/drain region). The Si:B layer can act as an etch protection layer to protect the source/drain region during the RPG process. However, due to silicon crystallographic properties, the Si:B layer formed on the (100) orientation substrate exhibits a facet limited growth behavior on (111) orientation, resulting in a triangular cross-sectional epi profile, which is insufficient to prevent etchant in the RPG process from leaking to the source/drain region, and thus the triangular cross-sectional Si:B layer may provide insufficient protection for the source/drain region.

Therefore, the present disclosure in various embodiments provides a Si:B layer formed on the (110) orientation substrate. The Si:B layer formed on the (110) orientation substrate can have a rectangular cross-sectional profile to provide more volume to retard etchant leakage during the RPG process, which in turn allows for protecting the source/drain region. In addition, the rectangular cross-sectional Si:B layer can have more boron doping than triangle cross-sectional profile, thus providing more boron diffusivity therein after annealing, and it will reduce $R_{ch}$ to get a better device performance and junction push.

FIGS. 1-13 are views of intermediate stages in the manufacturing of nano-FETs, in accordance with some embodiments. FIGS. 2, 3, 4, and 5 are three-dimensional views. FIGS. 6, 7, 8, 9A, 10, 11, 12, and 13 illustrate reference cross-section A-A' illustrated in FIG. 5. Referring to FIG. 1, in some embodiments, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 may have a p-type region 50P. The p-type region 50P can be for forming p-type devices, such as PMOS transistors, e.g., p-type nano-FETs. Although one p-type region 50P are illustrated, any number of p-type regions 50P may be provided. The substrate 50 may be lightly doped with n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the p-type region 50P. The APT region may extend under the source/drain regions in the nano-FETs. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

In some embodiments, the substrate 50 has (110) surface orientation. This surface orientation can be used to control the orientation of the layers (e.g., a multi-layer stack 52) which are formed above the substrate 50. For example, the multi-layer stack 52 including alternating first semiconductor layers 54 and second semiconductor layers 56 formed on the (110) surface orientation substrate 50 also can have (110) surface orientation. The (110) surface orientation semiconductor layers 56 can act as channel layers (see FIG. 6) and improves device performance ($I_{deff}$) due to a higher hole mobility on <110>/(110) than <110>/(001). Furthermore, the arrangement of some layers which are above the substrate 50 may be influenced by the surface orientations of the substrate 50. For example, the (110) surface orientation of the substrate 50 can be used to assist in formation of rectangular cross-sectional source/drain (S/D) structure formed on the second semiconductor layers 56 as shown in FIG. 9A. A more detailed description will be described later.

In some embodiments, the first semiconductor layers 54 of the multi-layer stack 52 are formed of a first semiconductor material, and the second semiconductor layers 56 of the multi-layer stack 52 are formed of a second semiconductor material. The semiconductor materials may each be selected from the candidate semiconductor materials of the substrate 50. In some embodiments, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In some embodiments, and as will be subsequently described in greater detail, the first semiconductor layers 54 will be removed and the second semiconductor layers 56 will patterned to form channel regions for the nano-FETs in the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56. In some embodiments, the first semiconductor material of the first semiconductor layers 54 may be a material, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56. For example, the first semiconductor material of the first semiconductor layer may be made of silicon germanium, and the second semiconductor material of the second semiconductor layers 56 may be made of silicon.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of about 5 nm to about 30 nm. In some embodiments, some layers (e.g., the second semiconductor layers 56) are formed to be thinner than other layers (e.g., the first semiconductor layers 54). For example, in embodiments in which the first semiconductor layers 54 are sacrificial layers (or dummy layers) and the second semiconductor layers 56 are patterned to form channel regions for the nano-FETs in both the n-type region 50N and the p-type region 50P, the first semiconductor layers 54 can have a first thickness and the second semiconductor layers 56 can have a second thickness, with the second thickness being from about 30% to about 60% less than the first thickness. Forming the second semiconductor layers 56 to a smaller thickness allows the channel regions to be formed at a greater density.

Figure 2:
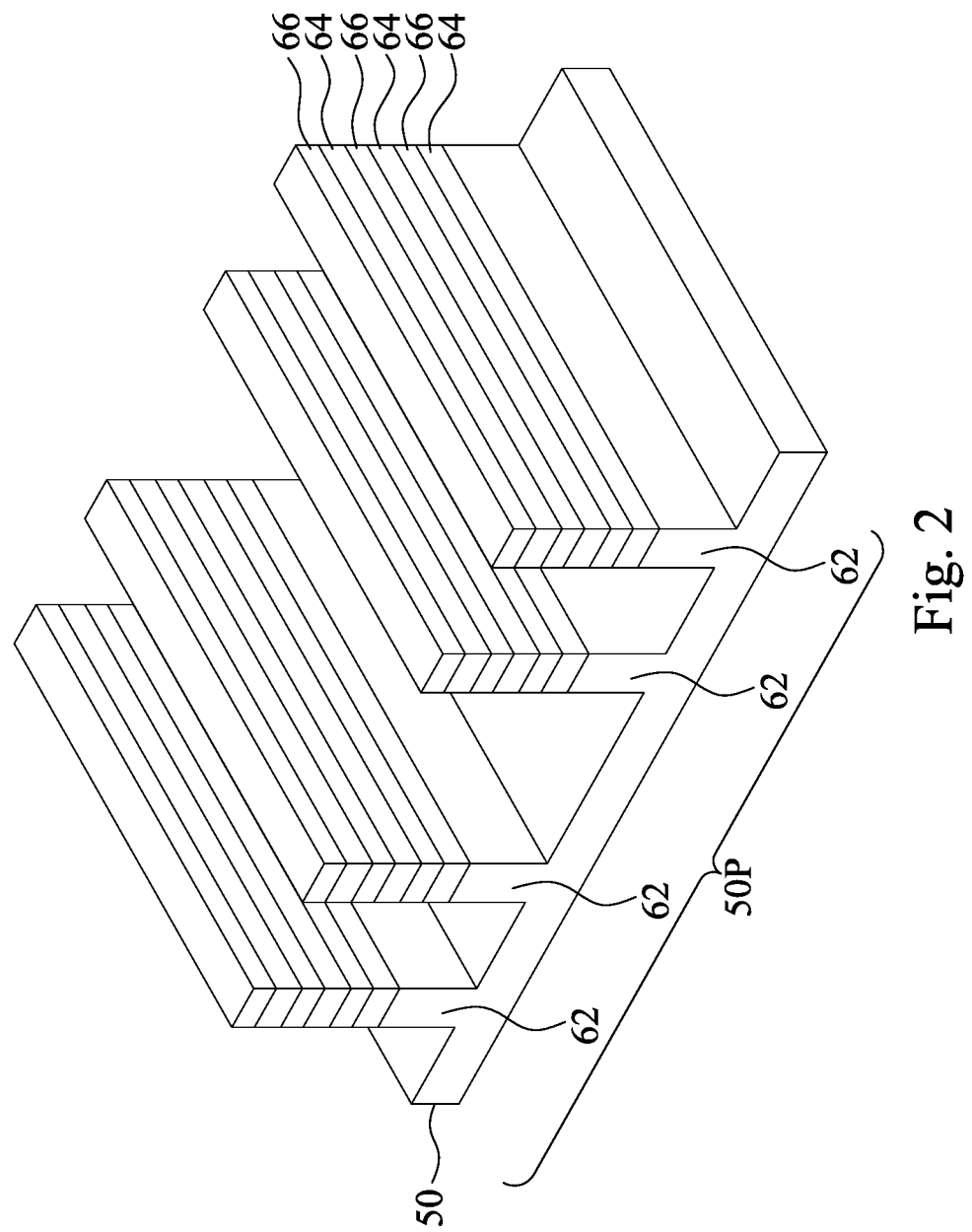

With reference to FIG. 2, trenches are patterned in the substrate 50 and the multi-layer stack 52 to form fins 62, first nanostructures 64, and second nanostructures 66. The fins 62 are semiconductor strips patterned in the substrate 50. In some embodiments, the fins 62 extend along the <1$\bar{1}$1> direction on the (110) orientation substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66. In some embodiments, the fins 62 and the nanostructures 64, 66 may each have widths in a range of about 8 nm to about 40 nm. In some embodiments, the fins 62 and the nanostructures 64, 66 have substantially equal widths.

Figure 3:
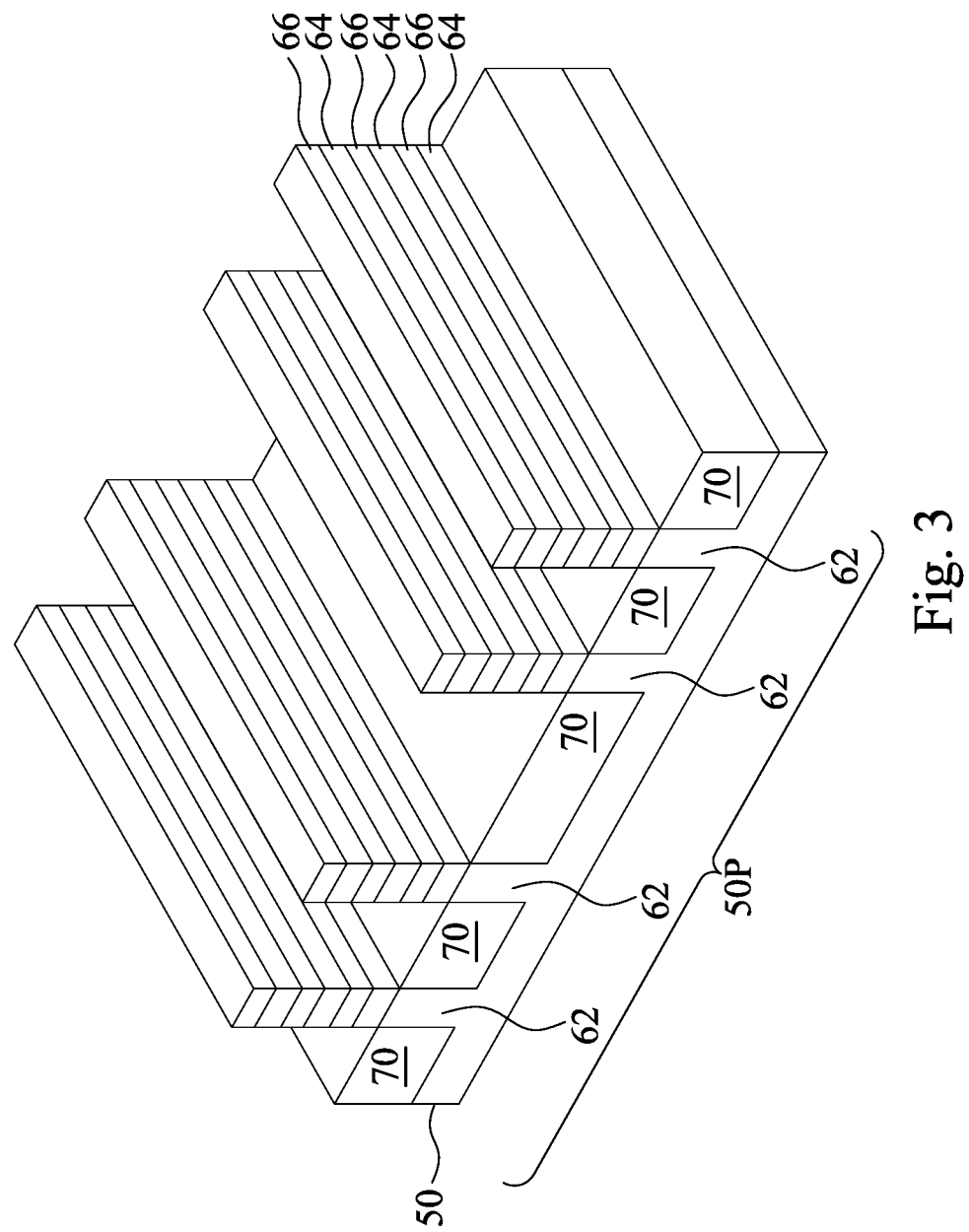

With reference to FIG. 3, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In some embodiments, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In some embodiments, no mask remains on the nanostructures 64, 66. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50. The wells may have a conductivity type opposite from a conductivity type of source/drain regions that will be subsequently formed in the p-type region 50P. In some embodiments, an n-type well may be formed in the p-type region 50P. In some embodiments, an n-type impurity implant is performed in the p-type region 50P. The n-type impurities may be phosphorus, arsenic, antimony, or the like implanted in the region to a concentration in the range of about $10^{13}$ cm$^{-3}$ to about $10^{14}$ cm$^{-3}$. After the implants of the p-type region 50P, an anneal may be performed to repair implant damage and to activate the n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 4:
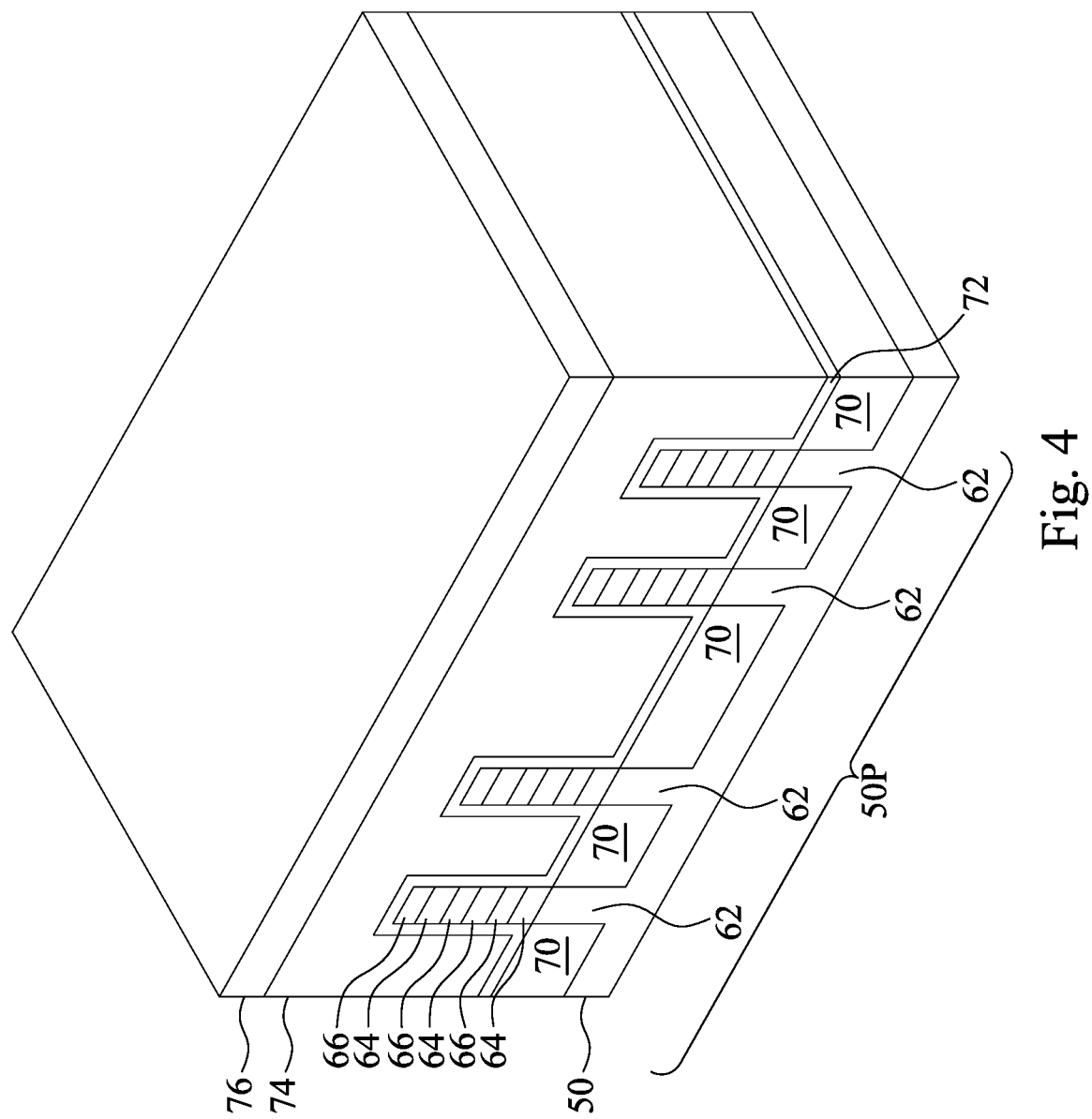

With reference to FIG. 4, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be formed of a dielectric material such as silicon nitride, silicon oxynitride, or the like. In this example, a single dummy gate layer 74 and a single mask layer 76 are formed across the p-type region 50P. In some embodiments, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 5:
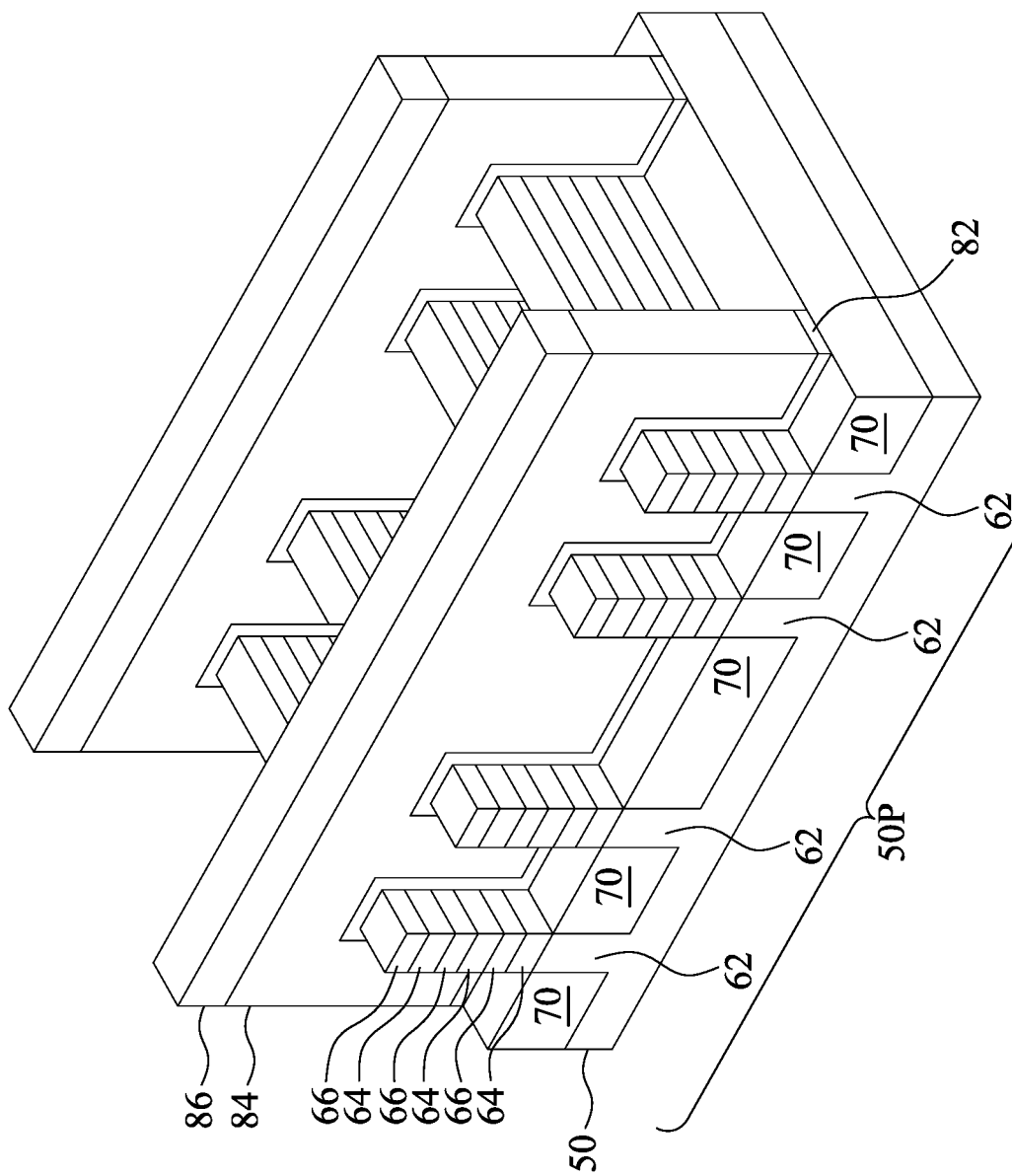

With reference to FIG. 5, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

Figure 6:
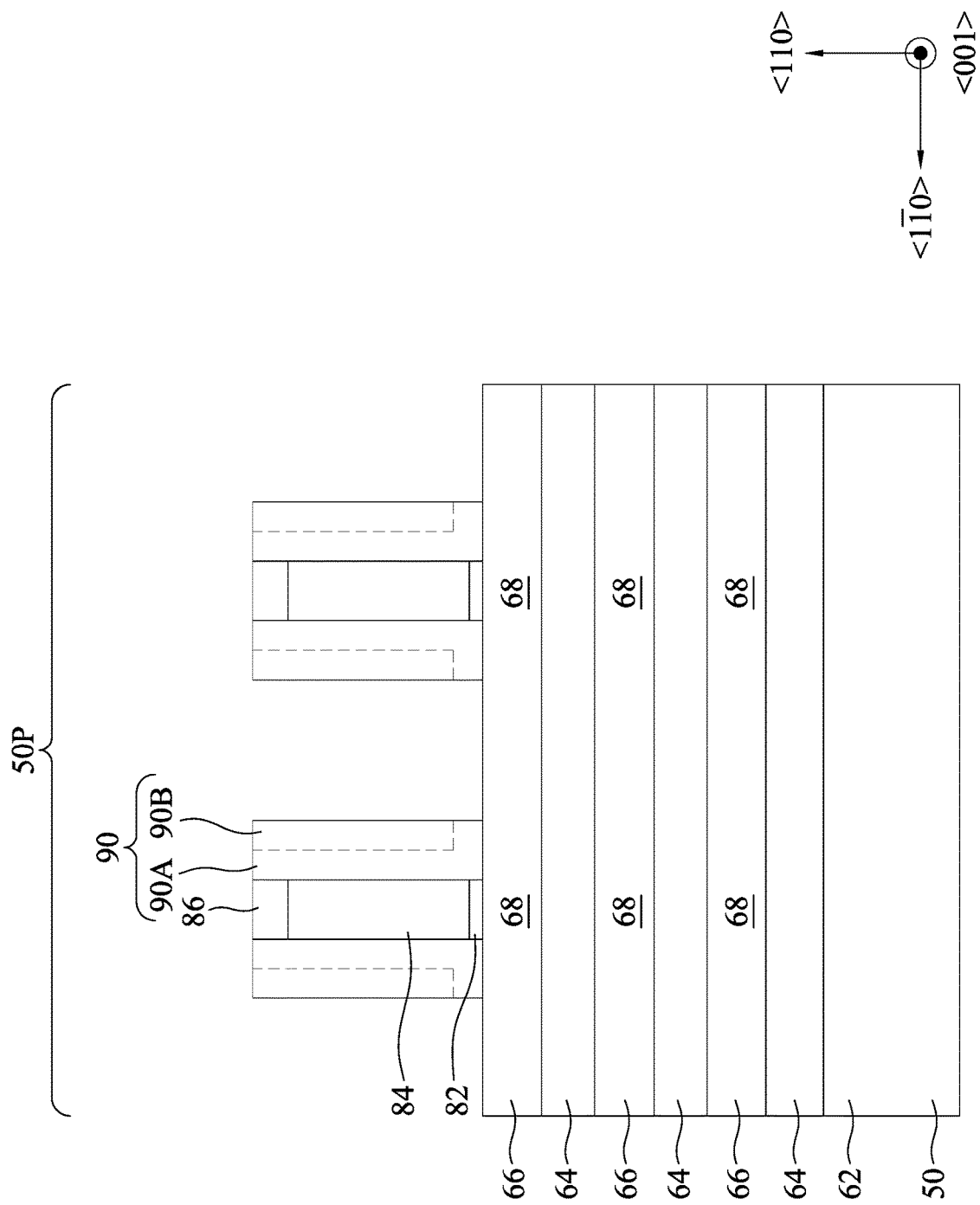

With reference to FIG. 6, gate spacers 90 are formed over the nanostructures 64, 66, on exposed sidewalls of the masks 86 (if present), the dummy gates 84, and the dummy dielectrics 82. The gate spacers 90 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. In some embodiments, the gate spacers 90 each include multiple layers, e.g., a first spacer layer 90A and a second spacer layer 90B. In some embodiments, the first spacer layers 90A and the second spacer layers 90B are formed of silicon oxycarbonitride (e.g., $SiO_xN_yC_{1-x-y}$, where x and y are in the range of 0 to 1), with the first spacer layers 90A formed of a similar or a different composition of silicon oxycarbonitride than the second spacer layers 90B. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). As will be subsequently described in greater detail, the dielectric material(s), when etched, may also have portions left on the sidewalls of the fins 62 and/or the nanostructures 64, 66 (thus forming fin spacers 92, see FIGS. 9C and 9D). After etching, the fin spacers 92 and/or the gate spacers 90 can have straight sidewalls (as illustrated) or can have curved sidewalls (not separately illustrated).

Further, implants may be performed to form lightly doped source/drain (LDD) regions (not separately illustrated). In some embodiments, p-type impurities may be implanted into the fins 62 and/or the nanostructures 64, 66 exposed in the p-type region 50P. The p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of about $10^{15}$ cm$^{-3}$ to about $10^{19}$ cm$^{-3}$. An anneal may be used to repair implant damage and to activate the implanted impurities. It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like.

Figure 7:
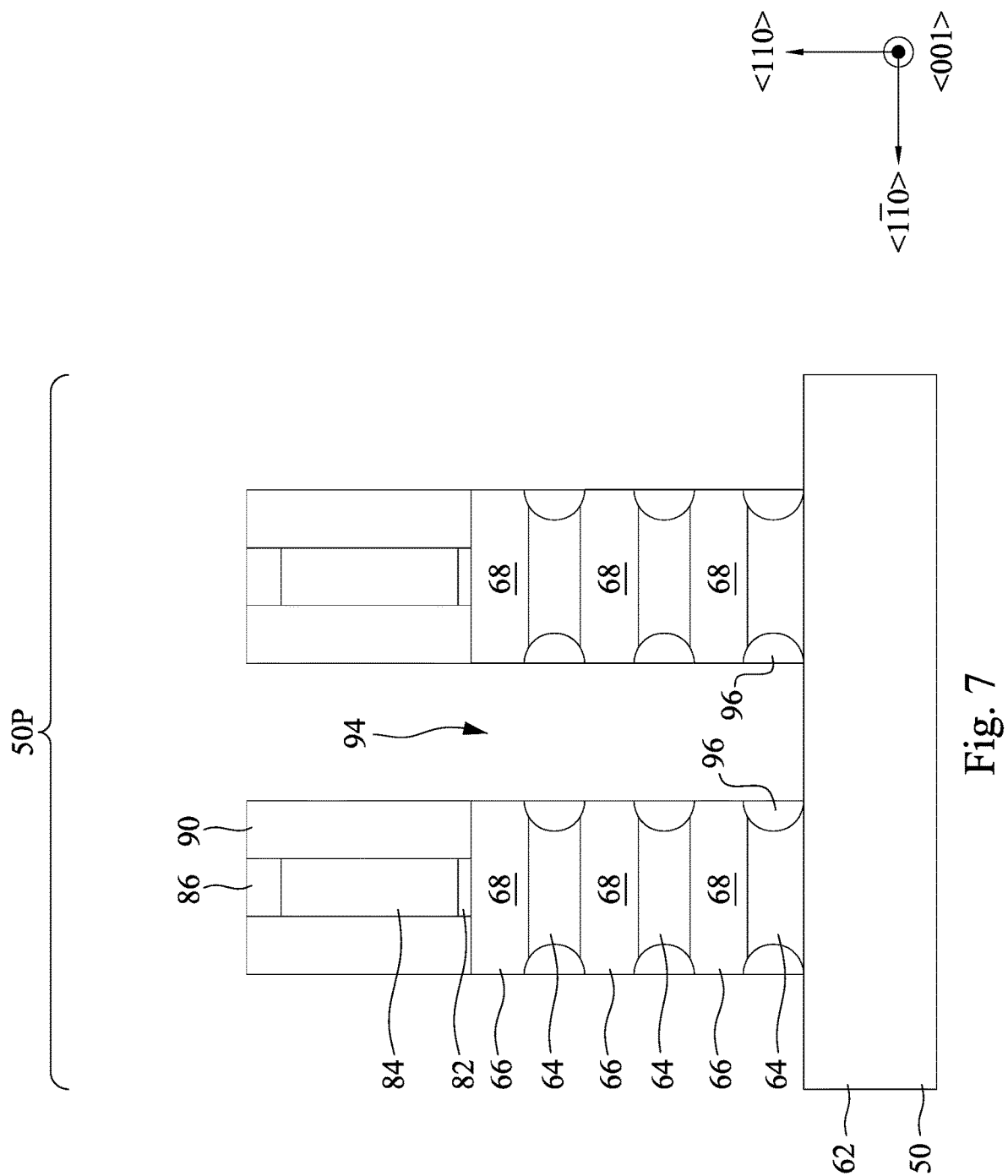

With reference to FIG. 7, source/drain recesses 94 are formed in the nanostructures 64, 66. In some embodiments, the source/drain recesses 94 extend through the nanostructures 64, 66 and to a top surface of the fin 62 without etching the fin 62. In some embodiments, the source/drain recesses 94 may also extend into the fins 62, such that bottom surfaces of the source/drain recesses 94 are disposed below the top surfaces of the STI regions 70; or the like. The source/drain recesses 94 may be formed by etching the nanostructures 64, 66 using an anisotropic etching process, such as a RIE, a NBE, or the like. The gate spacers 90 and the dummy gates 84 collectively mask portions of the fins 62 and/or the nanostructures 64, 66 during the etching processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being concave, the sidewalls may be straight or convex. The sidewalls may be recessed by any acceptable etching process, such as one that is selective to the material of the first nanostructures 64 (e.g., selectively etches the material of the first nanostructures 64 at a faster rate than the material of the second nanostructures 66). In some embodiments, portions of the nanostructures 66 adjacent to the nanostructures 66 may be etched. The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first nanostructures 64.

Subsequently, the inner spacers 96 can be formed by conformally forming an insulating material and subsequently etching the insulating material. The insulating material may be silicon nitride, silicon carbon nitride (SiCN), silicon oxycarbonitride (SiOCN), silicon oxynitride, or any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figure 8:
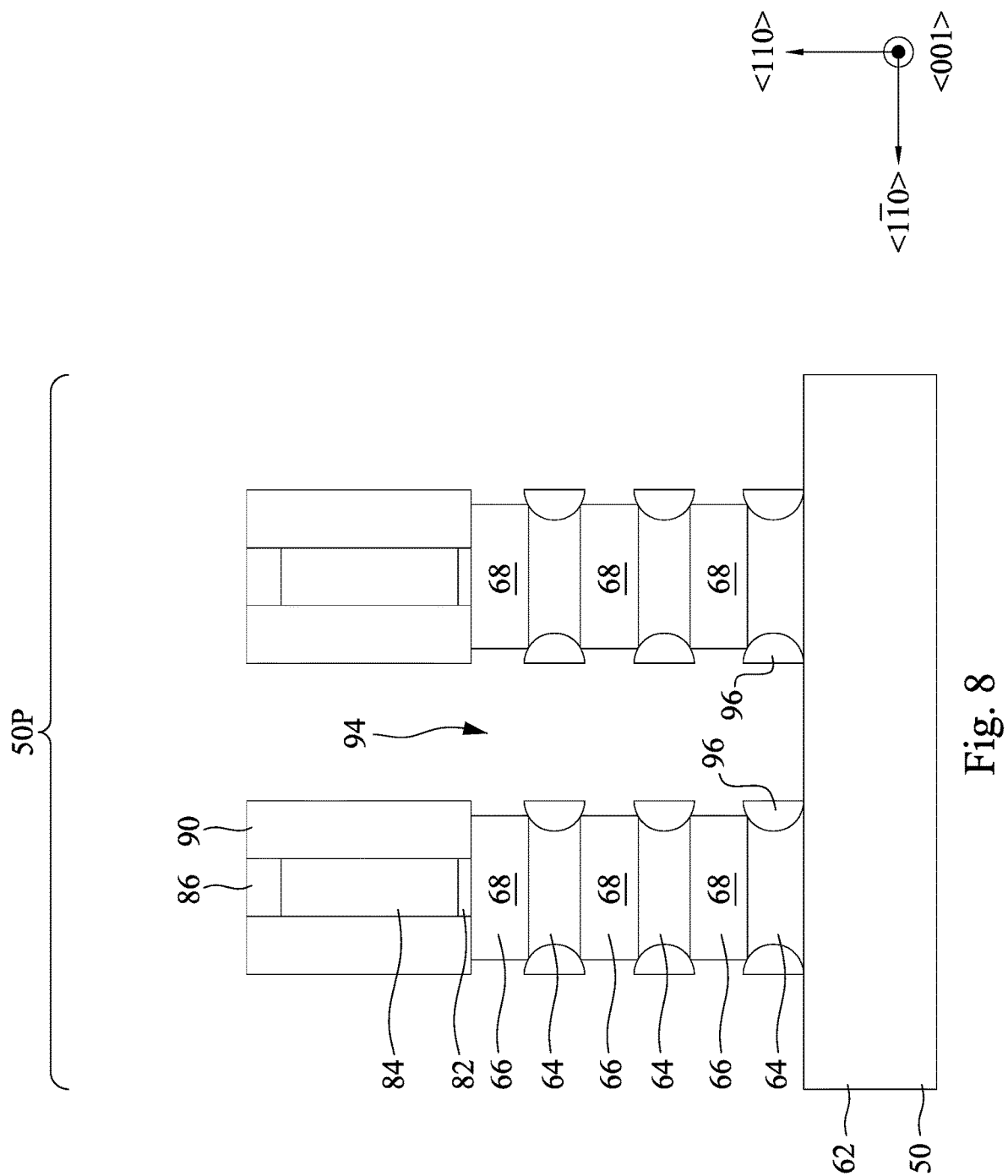

With reference to FIG. 8, as an example to form a first semiconductor material layer 98A as shown in FIG. 9A, the source/drain recesses 94 can be further laterally expanded. Specifically, portions of the sidewalls of the second nanostructures 66 exposed by the source/drain recesses 94 may be recessed. Although sidewalls of the second nanostructures 66 are illustrated as being straight, the sidewalls may be concave or convex. The sidewalls may be recessed by any acceptable etching process, such as one that is selective to the material of the second nanostructures 66 (e.g., selectively etches the material of the second nanostructures 66 at a faster rate than the material of the inner spacers 96). The etching may be isotropic. For example, when the first nanostructures 64 are formed of silicon and the second nanostructures 66 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas.

With reference to FIG. 9A, epitaxial source/drain regions 98 are formed in the source/drain recesses 94, such that each dummy gate 84 (and corresponding channel regions 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the p-type region 50P are epitaxially grown in the source/drain recesses 94 of the p-type region 50P. In some embodiments, the epitaxial source/drain regions 98 may be formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes. The epitaxial source/drain regions 98, the nanostructures 64, 66, and/or the fins 62 may be implanted with impurities, similar to the process previously described for forming LDD regions, followed by an anneal. In some embodiments, the epitaxial source/drain regions 98 are in-situ doped or undoped during the epi process. When the epitaxial source/drain regions 98 are undoped, they may be doped in a subsequent process. The doping may be achieved by an ion implantation process, plasma immersion ion implantation (PIII) process, gas and/or solid source diffusion process, or other suitable process.

Afterwards, the epitaxial source/drain regions 98 may be exposed further to annealing processes, such as a rapid thermal annealing process.

This is described in greater detail with reference to FIG. 9A, the epitaxial source/drain regions 98 may include one or more semiconductor material layers. For example, the epitaxial source/drain regions 98 may each include a first semiconductor material layer 98A, a second semiconductor material layer 98B grown on the first semiconductor material layer 98A, and a third semiconductor material layer 98C grown on the second semiconductor material layer 98B (or more generally, a first epitaxial layer, a second epitaxial layer, and a third epitaxial layer). Dash lines between neighboring second semiconductor material layers 98B are merged regions of neighboring second semiconductor material layers 98B grown from different first semiconductor material layers 98A. Any number of semiconductor material layers may be used for the epitaxial source/drain regions 98. Each of the first semiconductor material layer 98A, the second semiconductor material layer 98B, and the third semiconductor material layer 98C may be formed of different semiconductor materials and may be doped to different impurity concentrations.

Figure 12:
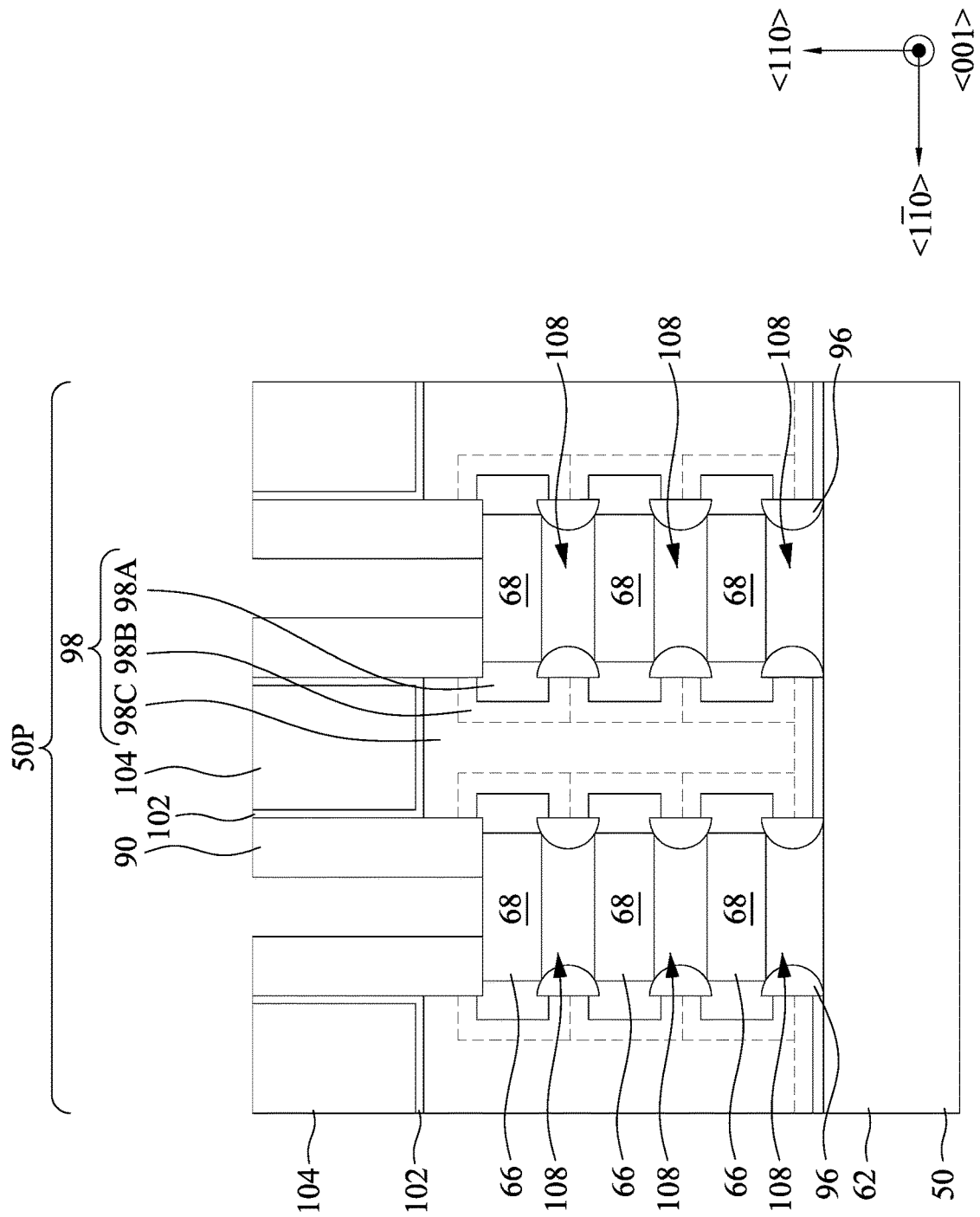

It is noted that in some embodiments, the first semiconductor material layer 98A can act as an etch protection layer during the etching for example of the first nanostructures 64 (e.g., silicon germanium) shown in FIG. 12. Thus, the thickness may be selected such that sufficient protection is provided, while maintaining the source/drain performance. In some embodiments, the first semiconductor material layer 98A can be interchangeably referred to an etch protection layer or a buffer layer. In some embodiments, the first semiconductor material layer 98A is doped with boron to have a higher etching selectivity than the second nanostructures 66 during an etching process as shown in FIG. 12, which in turn allows for protecting the semiconductor material layers 98B and 98C. As shown in FIG. 9A, the first semiconductor material layer 98A are in direct contact with an longitudinal end of the second nanostructure 66 and further warps around a tip corner of the inner spacer 96. In some embodiments, the first semiconductor material layer 98A is formed to extend from the second nanostructure 66 beyond a sidewall of the inner spacer 96.

The (110) surface orientation of the substrate 50 is used to assist in formation of rectangular cross-sectional semiconductor material layer 98A. This is described in greater detail with reference to FIG. 9A, The orientation of the first semiconductor material layer 98A is dependent on the orientation of the second nanostructure 66. The orientation of the first and second nanostructures 64 and 66 are dependent on the orientation of the substrate 50. Therefore, a rectangular cross-sectional profile of the first semiconductor material layer 98A is formed due to the surface orientations of the substrate 50. As mentioned above, the substrate 50 is designed to have the (110) surface orientation. The second nanostructures 66 formed on the (110) surface orientation substrate 50 also can have (110) surface orientation due to the epitaxial growth behavior. The first semiconductor material layer 98A formed on the (110) surface orientation nanostructure 66 can grow along a vertical direction (e.g. Y-axis) and a horizontal direction (e.g. X-axis) resulting in the rectangular cross-sectional profile due to the epitaxial growth behavior. More specifically, when the substrate 50 has (110) surface orientation and the channel directly below the dummy gate 84 extends along the <1$\bar{1}$0> directions, the sidewall of the first semiconductor material layer 98A can be, and the sidewall of the first semiconductor material layer 98A can be grown along the <110> direction. The growth rate of the first semiconductor material layer 98A along the vertical direction is greater than that of the first semiconductor material layer 98A along the horizontal direction. In some embodiments, a ratio of vertical growth rate to the horizontal growth rate is in a range from about 2 to about 5. When the ratio is within the above-mentioned range, rectangular cross-sectional first semiconductor material layer 98A can be obtained. Therefore, the (110) orientation semiconductor material layer 98A formed on the (110) surface orientation substrate 50 can have a rectangular cross-sectional profile to provide more volume to retard etchant leakage during the subsequent RPG process as shown in FIG. 12 than a triangle-like shape, which in turn allows for protecting the semiconductor material layers 98B and 98C.

Figure 9B:
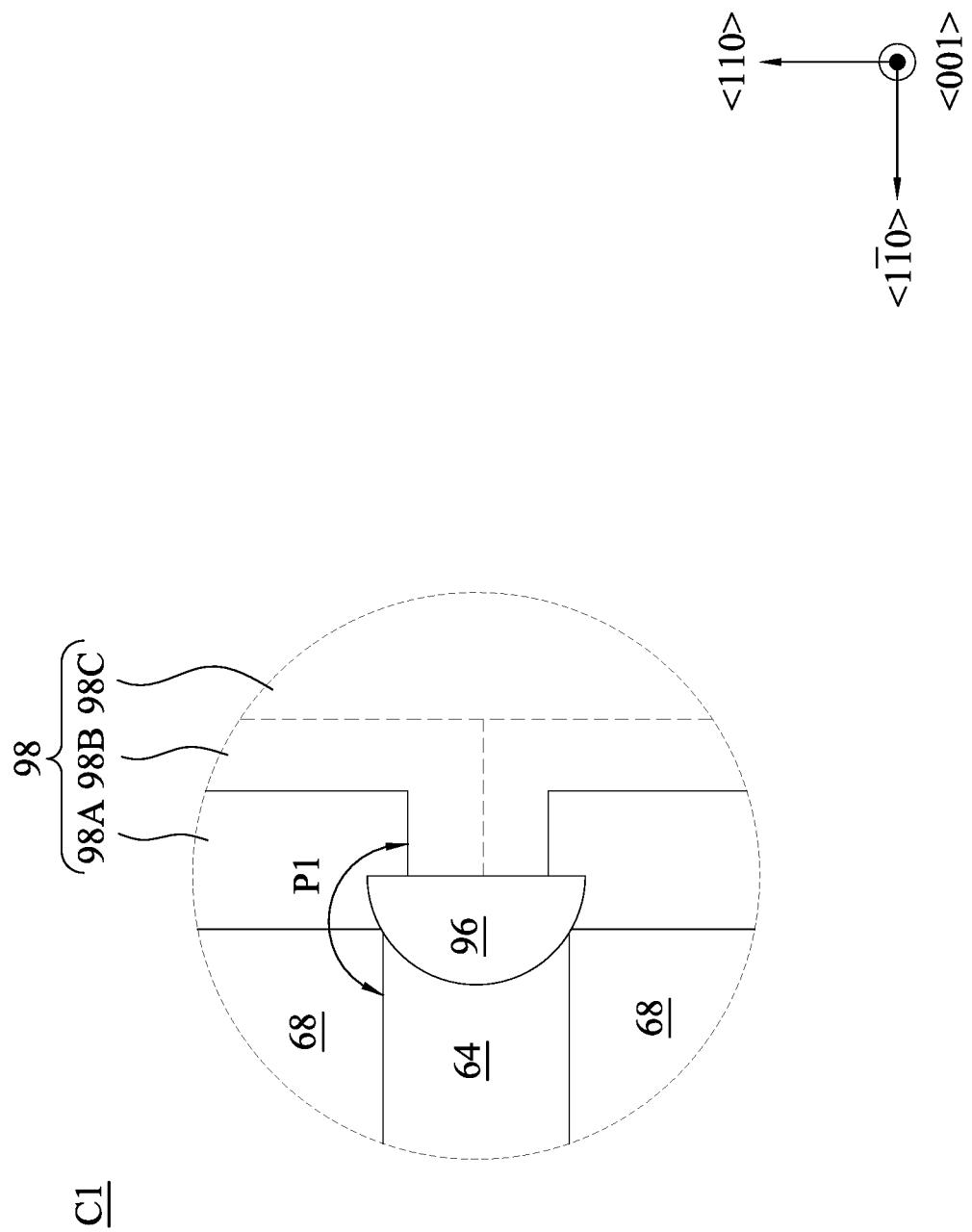
FIG. 9B illustrates a local enlarged view of a semiconductor device according to FIG. 9A in the region C1.
Figure 9D:
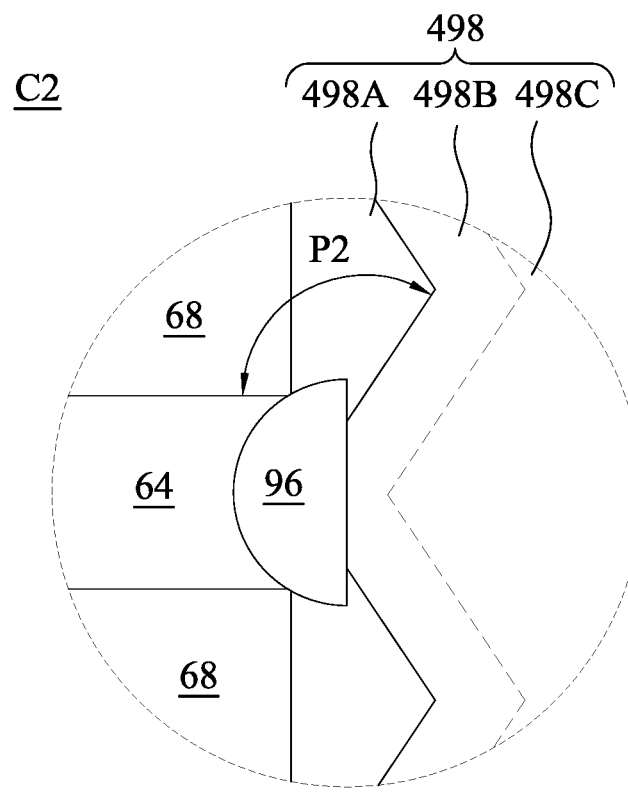
FIG. 9D illustrates a local enlarged view of a semiconductor device according to FIG. 9C in the region C2.

FIG. 9B illustrates a local enlarged view of the semiconductor device according to FIG. 9A in the region C1. FIG. 9C illustrates a cross-sectional view of another semiconductor device corresponding to FIG. 9A in accordance with some embodiments of the present disclosure. FIG. 9D illustrates a local enlarged view of the semiconductor device according to FIG. 9C in the region C2. In some embodiments, material and manufacturing method of a substrate 450, a fin 462, nanostructures 464, 466, a channel region 468, an inner spacer 496, semiconductor material layer 498A, 498B, 498C, a dummy dielectric 482, a dummy gate 484, and a mask 486 are substantially the same as those of the substrate 50, the fin 62, the nanostructures 64, 66, the channel region 68, the inner spacer 96, the semiconductor material layer 98A, 98B, 98C, the dummy dielectric 82, the dummy gate 84, and the mask 86 as shown in FIG. 9A, and the related detailed descriptions may refer to the foregoing paragraphs, and are not described again herein. The difference between the embodiment in FIG. 9A and the embodiment in FIG. 9C is that the substrate 50 in FIG. 9A has (110) surface orientation, and the substrate 450 in FIG. 9A has (100) surface orientation.

As shown in FIGS. 9A and 9C, in order to prevent the source/drain region damage (e.g., EPI damage) during the replacement gate (RPG) process as shown in FIG. 12, boron doped silicon (Si:B) layers (e.g., the first semiconductor material layers 98A, 498A) are formed to interpose the channel layers (e.g., the channel regions 68 and 468) and the source/drain regions (e.g., the second and third semiconductor material layers 98B, 98C, 498B, 498C). The Si:B layers can act as etch protection layers to protect the source/drain regions during the RPG process. However, as shown in FIG. 9C, if the Si:B layers (e.g., the first semiconductor material layer 498A) are formed on the (100) orientation substrate 450, due to silicon crystallographic properties, the Si:B layers may exhibit a facet limited growth behavior on (111) orientation, resulting in triangular cross-sectional epi profiles, which is insufficient to prevent etchant in the RPG process from leaking to the source/drain region, and thus the triangular cross-sectional Si:B layers may provide insufficient protection for the source/drain region.

Therefore, as shown in FIG. 9A, if the Si:B layers (e.g., the first semiconductor material layers 98A) are formed on the (110) orientation substrate 50, due to silicon crystallographic properties, the Si:B layers can have rectangular cross-sectional profiles to provide more volume to retard etchant leakage during the RPG process, which in turn allows for protecting the source/drain region. For example, the semiconductor device having the semiconductor material layer 98A formed on the (110) orientation substrate shown in FIG. 9B has an etchant leakage path P1 (see the enlarged view of FIG. 9B), and the other semiconductor device having the semiconductor material layer 498A formed on the (100) orientation substrate shown in FIG. 9C has an etchant leakage path P2 (see the enlarged view of FIG. 9D). The etchant leakage path P1 shown in FIG. 9B is longer than the etchant leakage path P2 shown in FIG. 9D, such that the rectangular cross-sectional semiconductor material layer 98A can provide more volume to retard etchant leakage during the RPG process than the triangular cross-sectional semiconductor material layer 498A, which in turn allows for protecting the source/drain region.

In some embodiments, the first semiconductor material layer 98A may include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or a combination thereof. In some embodiments, the first semiconductor material layer 98A may be doped with one or more dopants. In some embodiments, the first semiconductor material layer 98A may be doped with a p-type dopant such as boron. Thus, in an example, the first semiconductor material layer 98A may be referred to as Si:B. The semiconductor material layer 98A having the rectangular cross-sectional profile can have more boron doping than the triangle-like shape. The first semiconductor material layer 98A has a greater boron diffusivity in silicon than in silicon germanium after thermal drive-in. Therefore, the first semiconductor material layer 98A can provide more boron diffusivity therein after annealing, and it will reduce $R_{ch}$ to get better device performance. In some embodiments, the first semiconductor material layer 98A may have a boron concentration less about $1 \times 10^{21}$ cm$^{-3}$. In some embodiments, the first semiconductor material layer 98A having a germanium atomic concentration less than about 10 at. %. In some embodiments, the first semiconductor material layer 98A is free from germanium.

In some embodiments, the forming of the first semiconductor material layer 98A is performed under a process pressure in a range from about 20 to about 50 torr, such as 20, 25, 30, 35, 40, 45, or 50 torr, and at a process temperature in a range from about 500 to about 780 degree C., such as 500, 520, 550, 600, 620, 650, 680, or 780 degree C. In some embodiments, the forming of the first semiconductor material layer 98A may use gaseous and/or liquid precursors, such as dichlorosilane (H$_2$SiCl$_2$, DCS), SiH$_4$, HCl, B$_2$H$_6$, combinations thereof, or any other suitable gaseous and/or liquid precursors.

In FIG. 9A, the second semiconductor material layer 98B can be interchangeably referred to a liner layer, and the third semiconductor material layer 98C can be interchangeably referred to a main layer. The second and third semiconductor material layer 98B and 98C may include any acceptable material appropriate for p-type devices. For example, the second and third semiconductor material layers 98B and 98C in the p-type region 50P may include materials exerting a compressive strain on the channel regions 68, such as silicon germanium, boron doped silicon germanium, germanium, germanium tin, or the like. Therefore, the epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66. The p-type impurities for second and third semiconductor material layers 98B and 98C may be any of the impurities previously described. In some embodiments, the second and third semiconductor material layers 98B and 98C may include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or a combination thereof. In some embodiments, the first semiconductor material layer 98A may doped with one or more dopants.

By way of example but not limitation, the second and third semiconductor material layers 98B and 98C may be epitaxially grown silicon germanium (SiGe). The second and third semiconductor material layers 98B and 98C may also be suitably doped with a p-type dopant such as boron. Therefore, in an example, the second semiconductor material layer 98B may be referred to as Si$_{1-x\_L1}$Ge$_{x\_L1}$:B, and the third semiconductor material layer 98C may be referred to as Si$_{1-x\_L2}$Ge$_{x\_L2}$:B. In some embodiments, the second semiconductor material layer 98B may have a boron concentration less than about $5 \times 10^{20}$ cm$^{-3}$. In some embodiments, the third semiconductor material layer 98C may have a boron concentration greater than about $4 \times 10^{20}$ cm$^{-3}$. In some embodiments, the first semiconductor material layer 98A may have a greater boron concentration than the second semiconductor material layer 98B. In some embodiments, the second semiconductor material layer 98B may have a greater boron concentration than the third semiconductor material layer 98C.

In some embodiments, the second semiconductor material layer 98B may have a greater germanium atomic concentration than the first semiconductor material layer 98A, such that a high germanium concentration in the second semiconductor material layer 98B increases stress exerted on the channel region 68, thereby increasing the mobility of carriers and reducing the resistance in the channel regions 68 of the resulting FinFETs. A high germanium concentration in the second semiconductor material layer 98B may also decreases the resistance in the epitaxial source/drain region 98, as the band gap of germanium is lower than the band gap of silicon. Therefore, reducing the resistance in the channel regions 68 and/or the epitaxial source/drain regions 98 may increase the performance of the resulting FinFETs. By way of example but not limitation, the second semiconductor material layer 98B may have a germanium atomic concentration less than about 40 at. %, such as 5, 10, 15, 20, 25, 30, 35, or 40 at. %.

In some embodiments, the third semiconductor material layer 98C may have a greater germanium atomic concentration than the second semiconductor material layer 98B, such that an epitaxial growth process for SiGeB with a high germanium concentration tend to have a bottom-up growth profile. The third semiconductor material layer 98C of the epitaxial source/drain regions 98 is formed in the source/drain recesses 94. The second semiconductor material layer 98B grows from the bottom of the epitaxial source/drain regions 98, and does not grow from the sidewalls of the epitaxial source/drain regions 98. In other words, the vertical growth rate (e.g., along the <110> direction) is greater during forming the third semiconductor material layer 98C than during forming the second semiconductor material layer 98B. Likewise, the lateral growth rate (e.g., along the <1$\overline{1}$0> direction) is lesser during forming the third semiconductor material layer 98C than during forming the second semiconductor material layer 98B. In some embodiments, the third semiconductor material layer 98C may form to overfill the source/drain recesses 94. By way of example but not limitation, the third semiconductor material layer 98C may have a germanium atomic concentration in a range from about 20 at. % to about 90 at. %, such as 20, 25, 30, 35, 40, 45, 50, 55, 60, 65, 70, 75, 80, 85, or 90 at. %.

The first semiconductor material layer 98A may has a thickness T1 along the <1$\bar{1}$1> direction, and the second semiconductor material layer 98B may has a thickness T2 along the <1$\bar{1}$1> direction. In some embodiments, the thickness T1 may be greater than the thickness T2. By way of example but not limitation, the thickness T1 may be in a range about 3 to 6 nm, such as 3, 3.5, 4, 4.5, 5, 5.5, or 6 nm. The thickness T2 may be in a range about 2 to 6 nm, such as 2, 2.5, 3, 3.5, 4, 5, or 6 nm.

Figure 9E:
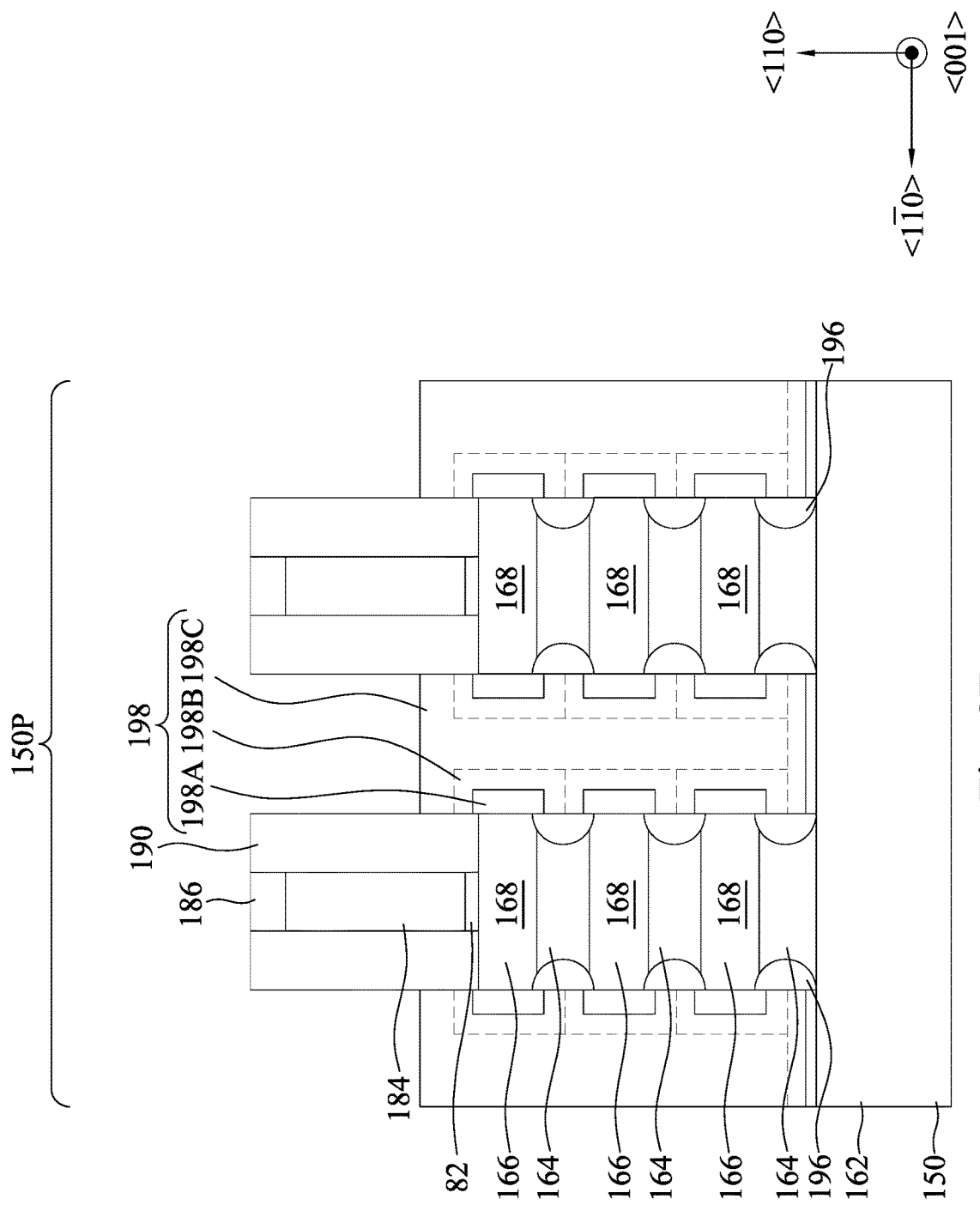
Figure 9F:
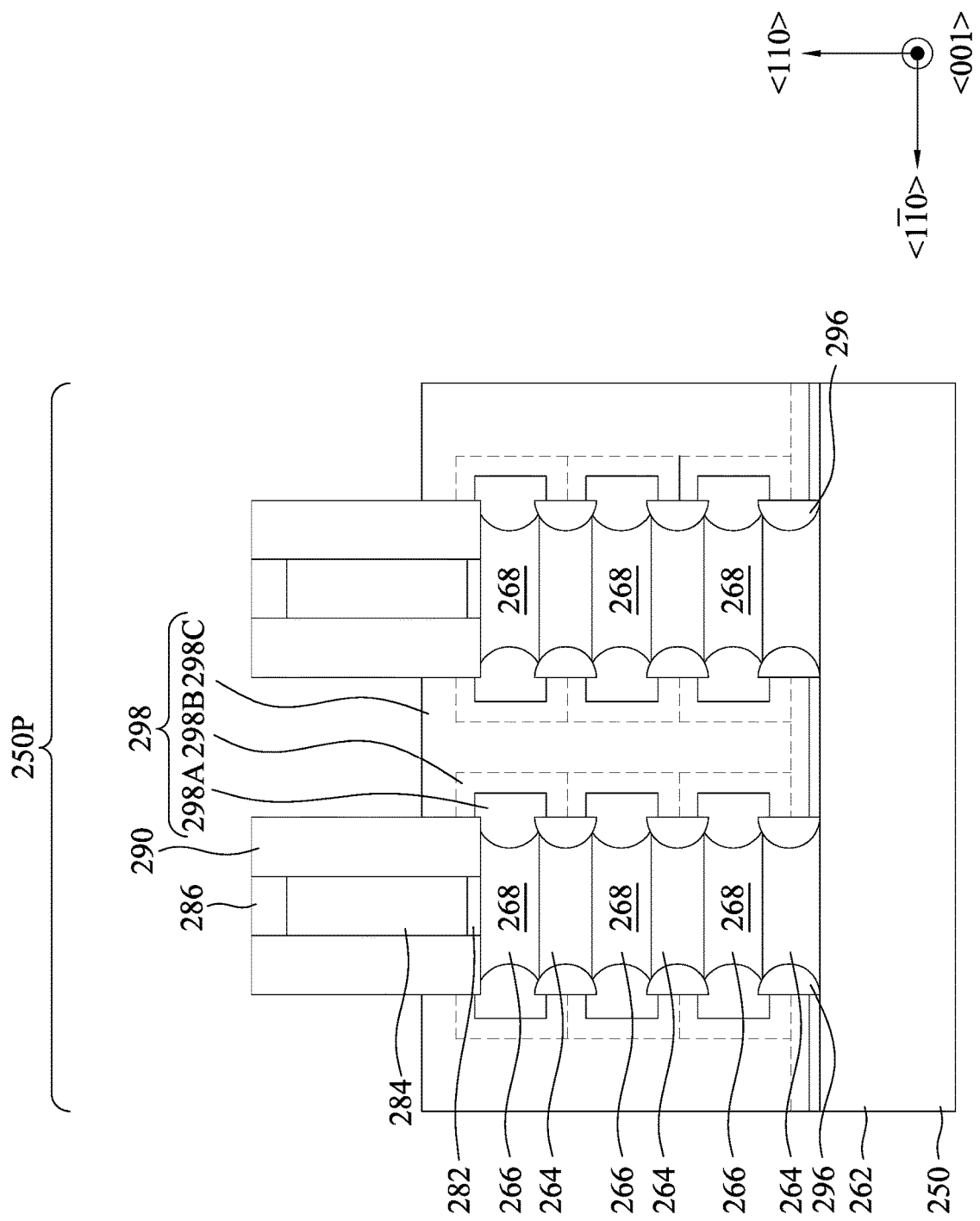
Figure 9G:
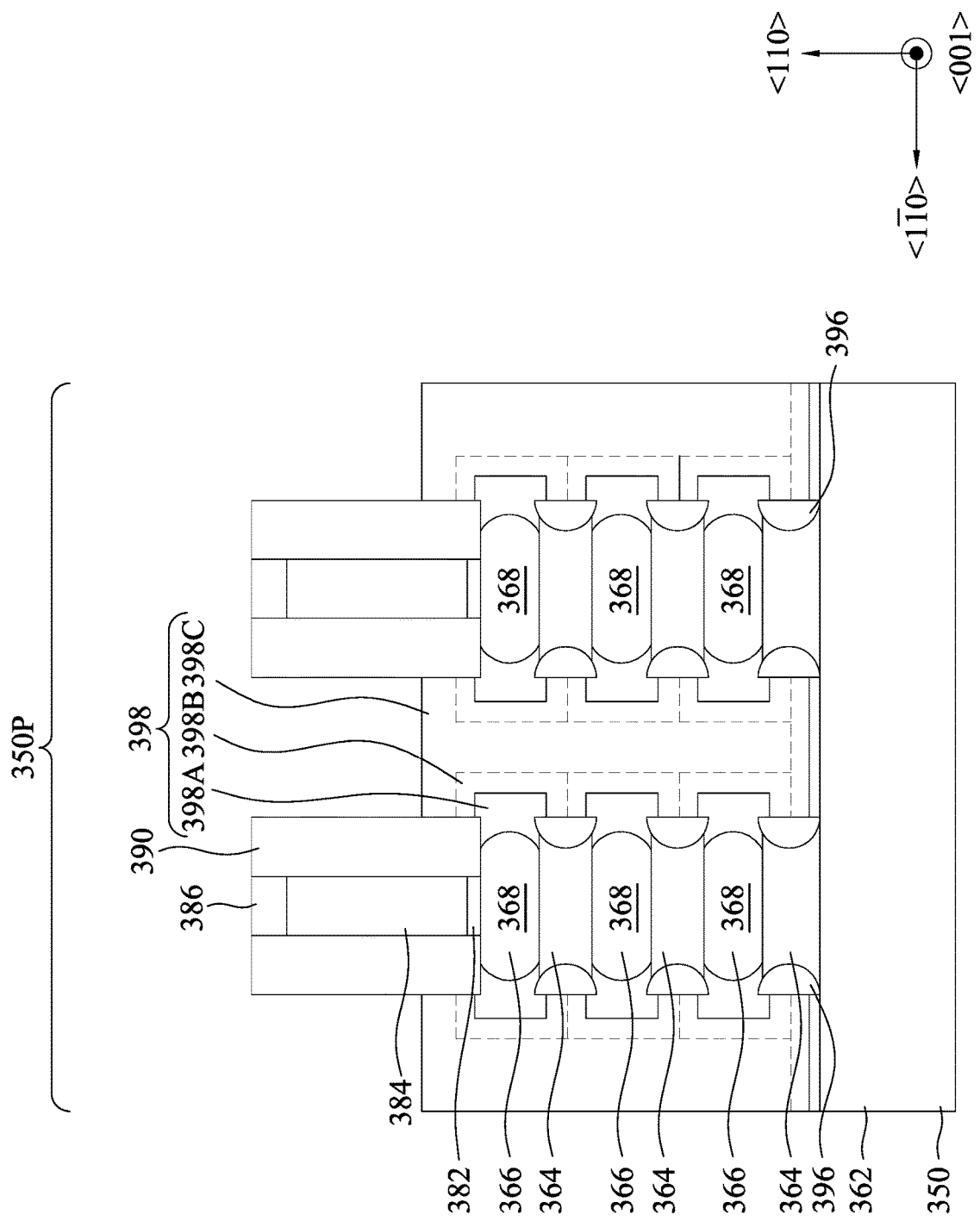

While FIGS. 9E-9G show some embodiments of the nano-FETs with second nanostructures and the first semiconductor material layer having different cross-sectional profiles than the second nanostructures 66 and the first semiconductor material layer 98A in FIG. 9A. The second nanostructures 66 as shown in FIG. 9A may be recessed to have a vertical flat end surface and the first semiconductor material layer 98A formed on the second nanostructures 66 may have a rectangular cross-sectional profile. In some embodiments, the second nanostructures 66 may not be recessed and have an end surface flush with the inner spacer 96. In some embodiments, the second nanostructures 66 may be recessed to have a concave-like end surface or a convex-like end surface.

As shown in FIG. 9E, second nanostructures 166 are not recessed, and thus have an end surfaces flush with inner spacers 196. In some embodiments, material and manufacturing method of a substrate 150, a fin 162, nanostructures 164, 166, a channel region 168, an inner spacer 196, semiconductor material layer 198A, 198B, 198C, a dummy dielectric 182, a dummy gate 184, and a mask 186 are substantially the same as those of the substrate 50, the fin 62, the nanostructures 64, 66, the channel region 68, the inner spacer 96, the semiconductor material layer 98A, 98B, 98C, the dummy dielectric 82, the dummy gate 84, and the mask 86 as shown in FIG. 9A, and the related detailed descriptions may refer to the foregoing paragraphs, and are not described again herein.

As shown in FIG. 9F, second nanostructures 266 may be recessed to have a convex-like end surface. In some embodiments, material and manufacturing method of a substrate 250, a fin 262, nanostructures 264, 266, a channel region 268, an inner spacer 296, semiconductor material layer 298A, 298B, 298C, a dummy dielectric 282, a dummy gate 284, and a mask 286 are substantially the same as those of the substrate 50, the fin 62, the nanostructures 64, 66, the channel region 68, the inner spacer 96, the semiconductor material layer 98A, 98B, 98C, the dummy dielectric 82, the dummy gate 84, and the mask 86 as shown in FIG. 9A, and the related detailed descriptions may refer to the foregoing paragraphs, and are not described again herein.

As shown in FIG. 9G, second nanostructures 366 may be recessed to have a concave-like end surface. In some embodiments, material and manufacturing method of a substrate 350, a fin 362, nanostructures 364, 366, a channel region 368, an inner spacer 396, semiconductor material layer 398A, 398B, 398C, a dummy dielectric 382, a dummy gate 384, and a mask 386 are substantially the same as those of the substrate 50, the fin 62, the nanostructures 64, 66, the channel region 68, the inner spacer 96, the semiconductor material layer 98A, 98B, 98C, the dummy dielectric 82, the dummy gate 84, and the mask 86 as shown in FIG. 9A, and the related detailed descriptions may refer to the foregoing paragraphs, and are not described again herein.

Figure 10:
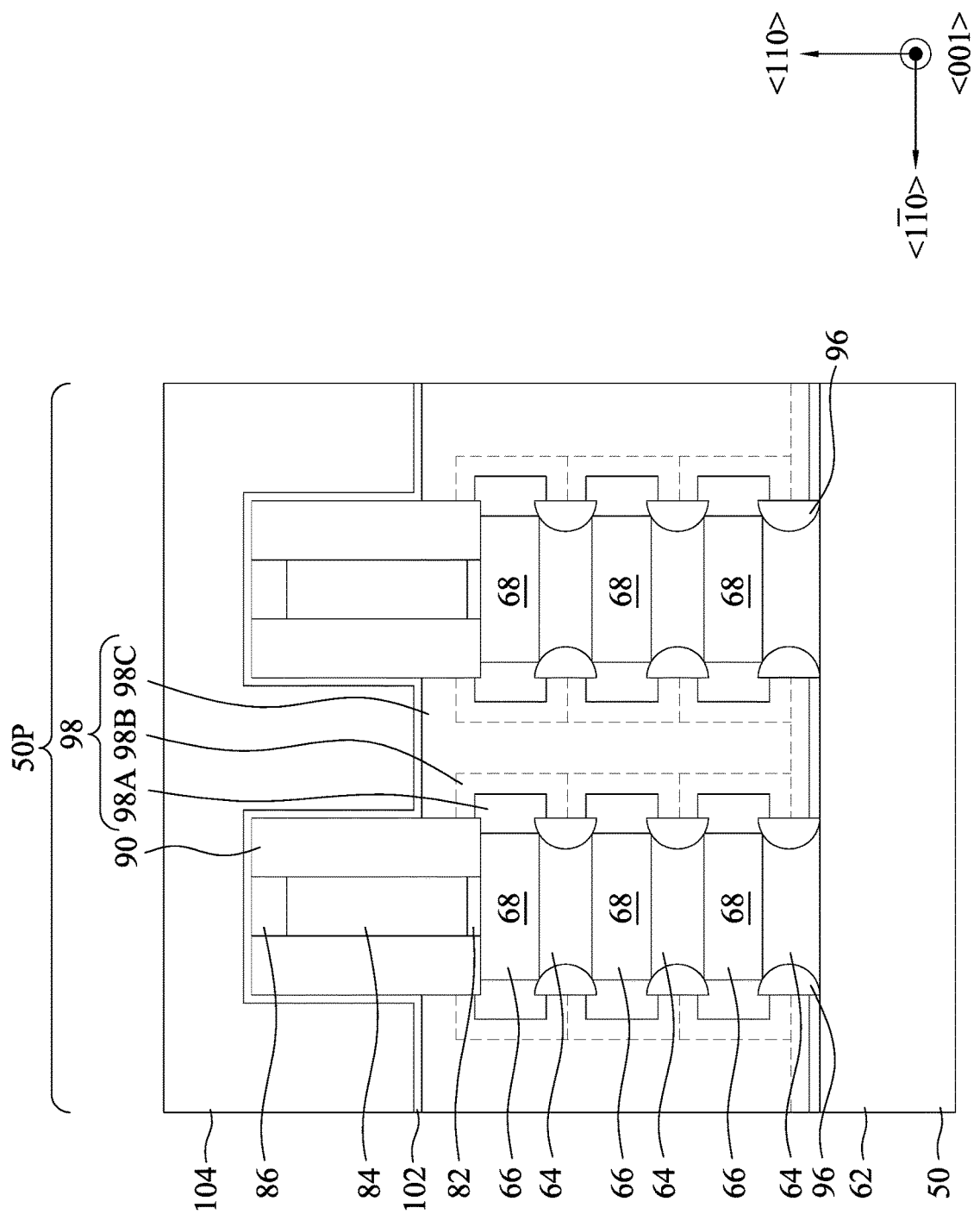

With reference to FIG. 10, a first inter-layer dielectric (ILD) 104 is deposited over the epitaxial source/drain regions 98, the gate spacers 90, the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by an any suitable method, such as CVD, ALD, or the like.

Figure 11:
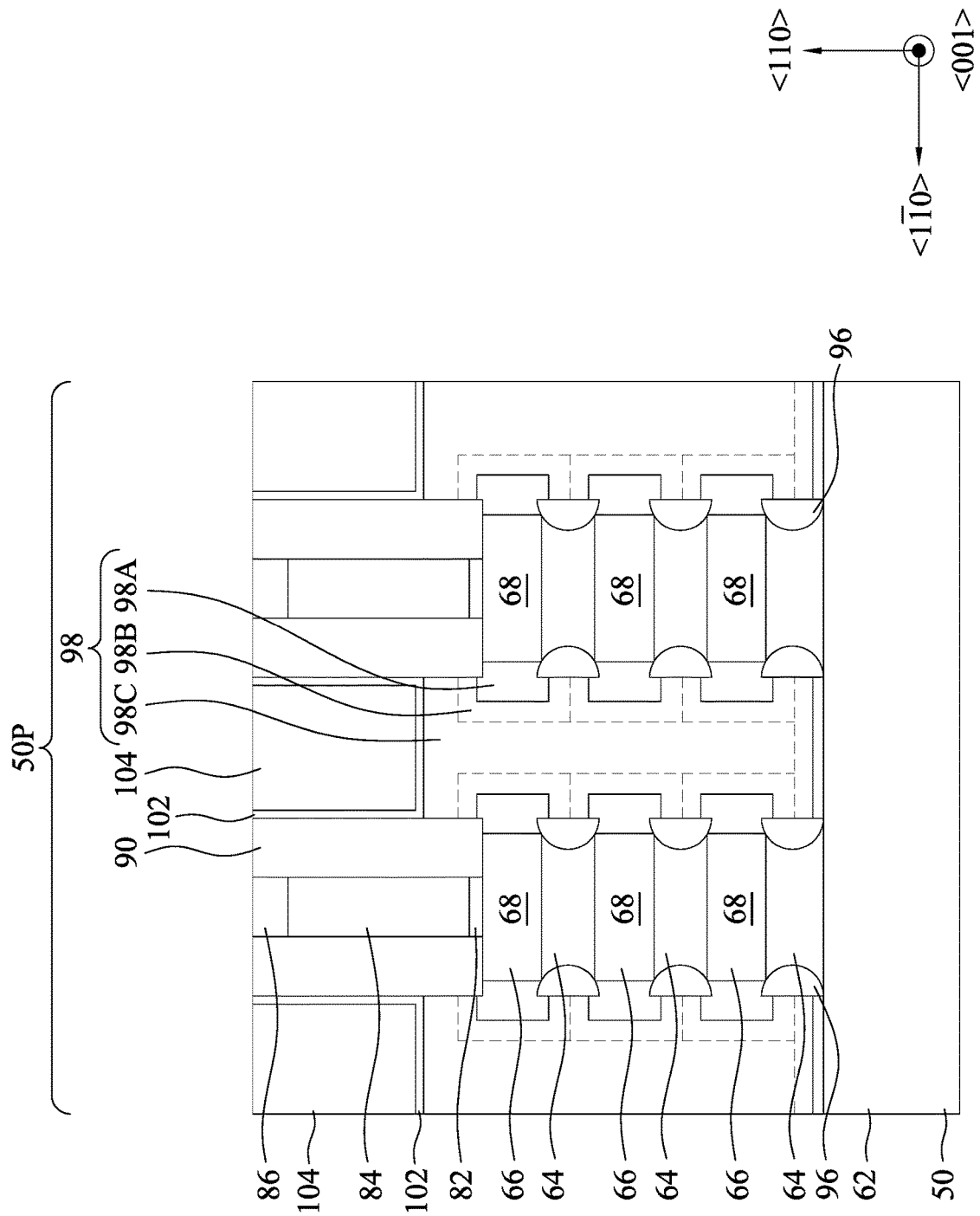

With reference to FIG. 11, a removal process is performed to level the top surfaces of the first ILD 104 with the top surfaces of the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In some embodiments, the masks 86 remain, and the planarization process levels the top surfaces of the first ILD 104 with the top surfaces of the masks 86.

With reference to FIG. 12, the masks 86 (if present) and the dummy gates 84 are removed in an etching process, so that recesses 106 are formed. Portions of the dummy dielectrics 82 in the recesses 106 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between adjacent pairs of the epitaxial source/drain regions 98.

The remaining portions of the first nanostructures 64 are then removed to expand the recesses 106, such that openings 108 are formed between the second nanostructures 66. The remaining portions of the first nanostructures 64 can be removed by any acceptable etching process that selectively etches the material of the first nanostructures 64 at a faster rate than the material of the second nanostructures 66 and then the first semiconductor material layer 98A. Therefore, the first semiconductor material layer 98A (e.g., boron doped silicon) can act as an etch protection layer during the etching of the first nanostructures 64 (e.g., silicon germanium).

The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide (NH$_4$OH), or the like. In some embodiments, a trim process (not separately illustrated) is performed to decrease the thicknesses of the exposed portions of the second nanostructures 66.

Figure 13:
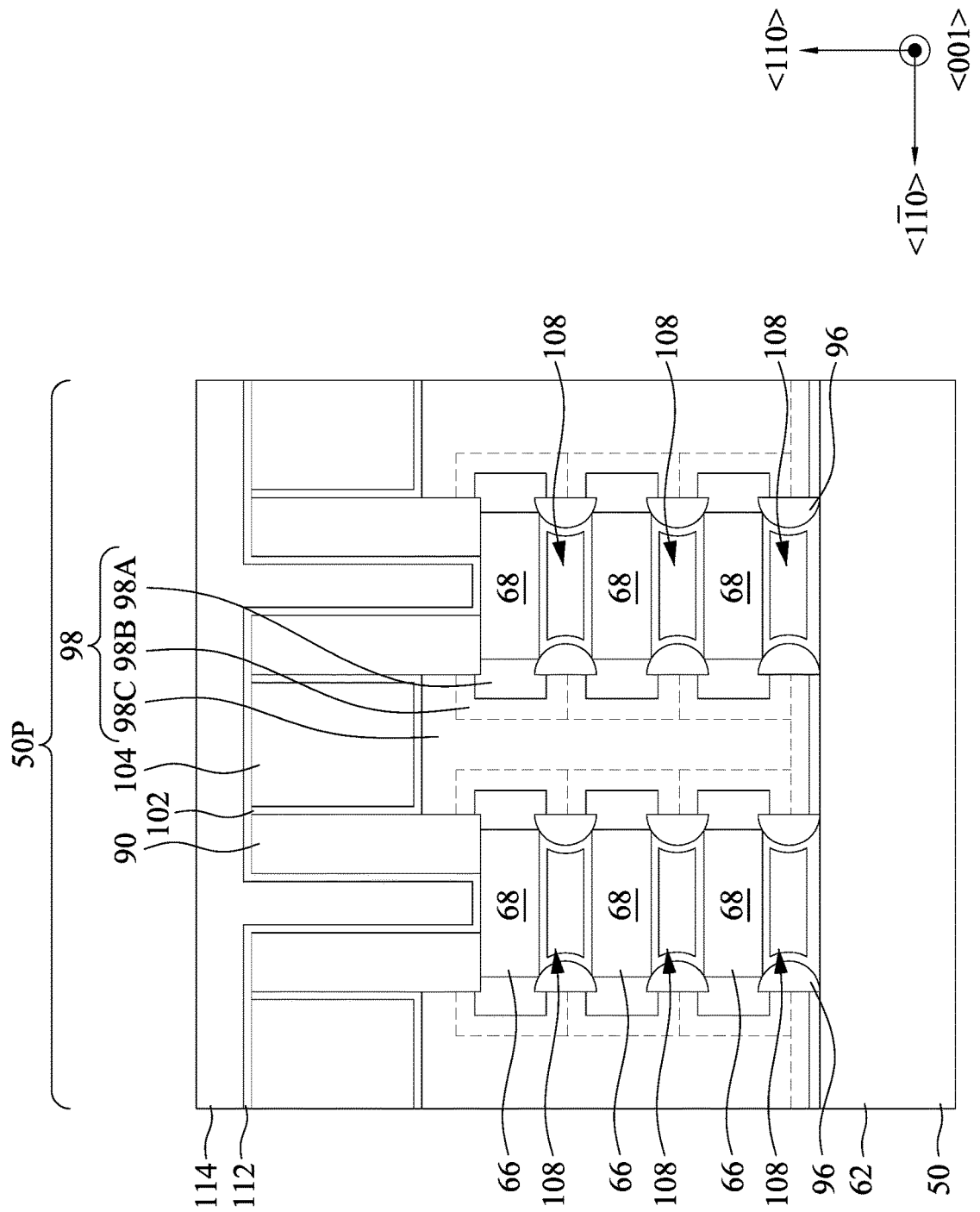

With reference to FIG. 13, a gate dielectric layer 112 is formed in the recesses 106. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIG. 13, as will be subsequently described in greater detail, the gate dielectric layer 112 may include any number of interfacial layers and any number of main layers.

The gate electrode layer 114 may include a metal-containing material such as titanium nitride, titanium oxide, tungsten, cobalt, ruthenium, aluminum, combinations thereof, multi-layers thereof, or the like. Although a single-layered gate electrode layer 114 is illustrated in FIG. 13, as will be subsequently described in greater detail, the gate electrode layer 114 may include any number of work function tuning layers, any number of barrier layers, any number of glue layers, and a fill material.

In order to prevent the source/drain region damage (e.g., EPI damage) during the replacement gate (RPG) process, a boron doped silicon (Si:B) layer is formed to interpose the channel layer and the source/drain region (e.g., PMOS source/drain region). The Si:B layer can act as an etch protection layer to protect the source/drain region during the RPG process. However, due to silicon crystallographic properties, the Si:B layer formed on the (100) orientation substrate exhibits a facet limited growth behavior on (111) orientation, resulting in a triangular cross-sectional epi profile, which is insufficient to prevent etchant in the RPG process from leaking to the source/drain region, and thus the triangular cross-sectional Si:B layer may provide insufficient protection for the source/drain region.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a Si:B layer formed on the (110) orientation substrate. The Si:B layer formed on the (110) orientation substrate can have a rectangular cross-sectional profile to provide more volume to retard etchant leakage during the RPG process, which in turn allows for protecting the source/drain region. In addition, the rectangular cross-sectional Si:B layer can have more boron doping than triangle cross-sectional profile, thus providing more boron diffusivity therein after annealing, and it will reduce $R_{ch}$ to get better device performance.

In some embodiments, a method includes forming a plurality of channel layers above a (110)-orientated substrate, the channel layers arranged in a <110> direction normal to a top surface the (110)-orientated substrate and extending in a <1$\bar{1}$0> direction perpendicular to the <110> direction; epitaxial growing a plurality of silicon layers on either side of each of the channel layers; doping the silicon layers with boron; epitaxial growing a plurality of first silicon germanium layers on the silicon layers; forming a gate structure surrounding each of the channel layers. In some embodiments, after epitaxial growing the silicon layers, the silicon layers each has a rectangular profile from a cross sectional view. In some embodiments, after epitaxial growing the silicon layers, a top surface of one of the silicon layers is in parallel with a bottom surface of a next one of the silicon layers above the one of the silicon layers. In some embodiments, epitaxial growing the silicon layers exhibits a facet growth behavior on a (111)-orientation. In some embodiments, epitaxial growing the silicon layers is performing by introducing a mixture gas comprising $SiH_4$ and $B_2H_6$ on the (110)-orientated substrate. In some embodiments, the method further includes: doping the first silicon germanium layers with the boron, the silicon layers having a higher boron concentration than the first silicon germanium layers after doping the first silicon germanium layers. In some embodiments, the silicon layers each has a germanium atomic concentration less than the first silicon germanium layers. In some embodiments, the silicon layers each has a germanium atomic concentration less than about 10 at. %. In some embodiments, the silicon layers are free from germanium. In some embodiments, the method further includes: epitaxial growing a plurality of second silicon germanium layers on the first silicon germanium layers, the second silicon germanium layers having a higher germanium atomic concentration than the first silicon germanium layers.

In some embodiments, a method includes forming a multi-layer stack including alternating a plurality of channel layers and a plurality of sacrificial layers stacked in a vertical direction on a silicon substrate having a (110) surface orientation; forming a plurality of epitaxial buffer layer on either side of each of the channel layers; doping the epitaxial buffer layer with a dopant; forming a plurality of epitaxial source/drain regions on the epitaxial buffer layer, wherein each of the epitaxial source/drain regions is on three sides of a corresponding one of the epitaxial buffer layer and is made of a different material than the epitaxial buffer layers; replacing the sacrificial layers with a gate structure. In some embodiments, the channel layers each has a length extending along a <1$\bar{1}$0> direction on the (110) surface orientation. In some embodiments, the epitaxial buffer layer are made of silicon, and the epitaxial source/drain regions are made of silicon germanium. In some embodiments, the dopant comprises boron. In some embodiments, the gate structure is of a p-type metal-oxide-semiconductor device.

In some embodiments, the semiconductor device includes a (110)-orientated substrate, channel layers, a gate structure, source/drain structures, inner spacers, and silicon buffer layers. The channel layers are above the (110)-orientated substrate. The channel layers extend in a <1$\bar{1}$0> direction on the (110)-orientated substrate and are arranged in a vertical direction. The gate structure surrounds each of the channel layers. The source/drain structures are on either side of the gate structure. The inner spacers interpose the gate structure and the source/drain structures. The silicon buffer layers interpose the channel layers and the source/drain structures. The silicon buffer layers each has two horizontal side surfaces and a vertical side surface between the two horizontal side surfaces from a cross sectional view. In some embodiments, one of the silicon buffer layers has a notched corner, and a corresponding one of the inner spacers is inlaid in the notched corner. In some embodiments, end surfaces of the channel layers are coterminous with sidewalls of the inner spacers. In some embodiments, end surfaces of the channel layers are concave. In some embodiments, end surfaces of the channel layers are convex.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of channel layers above a (110)-orientated substrate, the channel layers arranged in a <110> direction normal to a top surface of the (110)-orientated substrate and extending in a <110> direction perpendicular to the <110> direction;
    epitaxial growing a plurality of silicon layers on either side of each of the channel layers;
    doping the silicon layers with boron;
    epitaxial growing a plurality of first silicon germanium layers on the silicon layers;
    forming a gate structure surrounding each of the channel layers; and
    epitaxial growing a plurality of second silicon germanium layers on the first silicon germanium layers, the second silicon germanium layers having a higher germanium atomic concentration than the first silicon germanium layers.

2. The method of claim 1, wherein after epitaxial growing the silicon layers, the silicon layers each has a rectangular profile from a cross sectional view.

3. The method of claim 1, wherein after epitaxial growing the silicon layers, a top surface of one of the silicon layers is in parallel with a bottom surface of a next one of the silicon layers above the one of the silicon layers.

4. The method of claim 1, wherein epitaxial growing the silicon layers exhibits a facet growth behavior on a (111)-orientation.

5. The method of claim 1, wherein epitaxial growing the silicon layers is performing by introducing a mixture gas comprising SiH4 and B2H6 on the (110)-orientated substrate.

6. The method of claim 1, further comprising:
    doping the first silicon germanium layers with the boron, the silicon layers having a higher boron concentration than the first silicon germanium layers after doping the first silicon germanium layers.

7. The method of claim 1, wherein the silicon layers each has a germanium atomic concentration less than the first silicon germanium layers.

8. The method of claim 1, wherein the silicon layers each has a germanium atomic concentration less than about 10 at. %.

9. The method of claim 1, wherein the silicon layers are free from germanium.

10. A method, comprising:
    forming a multi-layer stack including alternating a plurality of channel layers and a plurality of sacrificial layers stacked in a vertical direction on a silicon substrate having a (110) surface orientation;
    forming a plurality of inner spacers on either side of each of the sacrificial layers;
    forming a plurality of epitaxial buffer layers on either side of each of the channel layers, wherein one of the epitaxial buffer layers has a notched corner, and a corresponding one of the inner spacers is inlaid in the notched corner;
    doping the epitaxial buffer layers with a dopant;
    forming a plurality of epitaxial source/drain regions on the epitaxial buffer layers, wherein each of the epitaxial source/drain regions is on three sides of a corresponding one of the epitaxial buffer layers and is made of a different material than the epitaxial buffer layers; and
    replacing the sacrificial layers with a gate structure.

11. The method of claim 10, wherein the channel layers each has a length extending along a <110> direction on the (110) surface orientation.

12. The method of claim 10, wherein the epitaxial buffer layers are made of silicon, and the epitaxial source/drain regions are made of silicon germanium.

13. The method of claim 10, wherein the dopant comprises boron.

14. The method of claim 10, wherein the gate structure is of a p-type metal-oxide-semiconductor device.

15. The method of claim 10, wherein end surfaces of the channel layers share a border with the inner spacers.

16. The method of claim 10, wherein end surfaces of the channel layers are concave.

17. A method for forming a semiconductor device, comprising:
    forming a plurality of channel layers above a (110)-orientated substrate, the channel layers extending in a <110> direction on the (110)-orientated substrate and arranged in a vertical direction, wherein end surfaces of the channel layers are concave;
    forming a gate structure surrounding each of the channel layers;
    forming a plurality of source/drain structures on either side of the gate structure;
    forming a plurality of inner spacers interposing the gate structure and the source/drain structures; and
    forming a plurality of silicon buffer layers interposing the channel layers and the source/drain structures, the silicon buffer layers each having two horizontal side surfaces and a vertical side surface between the two horizontal side surfaces from a cross sectional view.

18. The method of claim 17, wherein one of the silicon buffer layers has a notched corner, and a corresponding one of the inner spacers is inlaid in the notched corner.

19. The method of claim 17, wherein end surfaces of the channel layers share a border with the inner spacers.

20. The method of claim 17, wherein the plurality of silicon buffer layers include germanium.

* * * * *